(12) United States Patent
Hiraoka

(10) Patent No.: US 9,040,967 B2
(45) Date of Patent: May 26, 2015

(54) METHOD FOR MANUFACTURING ORGANIC ELECTROLUMINESCENCE DEVICE AND ORGANIC ELECTROLUMINESCENCE DEVICE

(75) Inventor: Tomomi Hiraoka, Hyogo (JP)

(73) Assignee: JOLED INC., Tokyo (JP)

( * ) Notice: Subject to any disclaimer, the term of this patent is extended or adjusted under 35 U.S.C. 154(b) by 59 days.

(21) Appl. No.: 13/989,878

(22) PCT Filed: Dec. 1, 2010

(86) PCT No.: PCT/JP2010/007015
§ 371 (c)(1),
(2), (4) Date: May 28, 2013

(87) PCT Pub. No.: WO2012/073288
PCT Pub. Date: Jun. 7, 2012

(65) Prior Publication Data
US 2013/0248844 A1    Sep. 26, 2013

(51) Int. Cl.
*H01L 51/56* (2006.01)
*H05B 33/10* (2006.01)
*H01L 51/52* (2006.01)

(52) U.S. Cl.
CPC .......... *H01L 51/56* (2013.01); *H01L 2251/568* (2013.01); *H01L 51/5234* (2013.01); *H05B 33/10* (2013.01)

(58) Field of Classification Search
CPC ..... H01L 51/56; H01L 51/5234; H01L 51/52; H05B 33/10
USPC ................................................ 257/40; 438/4
See application file for complete search history.

(56) References Cited

U.S. PATENT DOCUMENTS

| 7,141,517 | B2 | 11/2006 | Kawaguchi et al. |
| 7,234,984 | B2 | 6/2007 | Nishikawa et al. |
| 7,258,586 | B2 | 8/2007 | Tamura et al. |
| 7,507,590 | B2 | 3/2009 | Konda |
| 7,611,745 | B2 | 11/2009 | Nishikawa et al. |
| 8,283,661 | B2 | 10/2012 | Miyazawa et al. |

(Continued)

FOREIGN PATENT DOCUMENTS

| JP | 2003-178871 | 6/2003 |
| JP | 2004-227852 | 8/2004 |

(Continued)

OTHER PUBLICATIONS

U.S. Appl. No. 13/984,641 to Yasuo Segawa et al., filed Aug. 9, 2013.

(Continued)

*Primary Examiner* — Selim Ahmed
(74) *Attorney, Agent, or Firm* — Greenblum & Bernstein, P.L.C.

(57) ABSTRACT

A method for manufacturing an organic electroluminescence device includes: preparing an organic electroluminescence device including a lower electrode, an organic layer including a light-emitting layer, and an upper electrode and having a part in which the lower electrode and the upper electrode are shorted, at least one of the lower electrode and the upper electrode being made of a transparent conductive material; and irradiating the transparent conductive material in at least one of the part where the lower electrode and the upper electrode are shorted and a part around the shorted part with a femtosecond laser, and increasing resistance by changing a structure of the transparent conductive material.

11 Claims, 21 Drawing Sheets

(56) References Cited

U.S. PATENT DOCUMENTS

| | | |
|---|---|---|
| 8,518,719 B2 | 8/2013 | Hiraoka et al. |
| 2002/0142697 A1* | 10/2002 | Yamagata et al. ............ 445/24 |
| 2003/0222861 A1 | 12/2003 | Nishikawa et al. |
| 2004/0202777 A1 | 10/2004 | Nishikawa et al. |
| 2005/0023523 A1 | 2/2005 | Kawaguchi et al. |
| 2005/0215163 A1 | 9/2005 | Tamura et al. |
| 2006/0178072 A1 | 8/2006 | Konda |
| 2007/0141942 A1 | 6/2007 | Kawaguchi et al. |
| 2009/0221141 A1* | 9/2009 | Cheng et al. ............... 438/609 |
| 2010/0044733 A1* | 2/2010 | Okabe et al. ............... 257/98 |
| 2011/0227104 A1 | 9/2011 | Miyazawa et al. |
| 2013/0044937 A1 | 2/2013 | Hiraoka |
| 2013/0078883 A1 | 3/2013 | Hiraoka |
| 2013/0102094 A1 | 4/2013 | Hiraoka et al. |

FOREIGN PATENT DOCUMENTS

| | | |
|---|---|---|
| JP | 2005-032576 | 2/2005 |
| JP | 2005-276600 | 10/2005 |
| JP | 2006-221982 | 8/2006 |
| JP | 2008-235177 | 10/2008 |
| JP | 2008-235178 | 10/2008 |
| JP | 2009-081093 | 4/2009 |
| JP | 2009-266687 | 11/2009 |
| JP | 2010-073327 | 4/2010 |
| WO | 2010/122782 | 10/2010 |

OTHER PUBLICATIONS

International Search Report (ISR) and Written Opinion in International Application No. PCT/JP2010/007015, dated Mar. 15, 2011.

* cited by examiner

METHOD FOR MANUFACTURING ORGANIC ELECTROLUMINESCENCE DEVICE AND ORGANIC ELECTROLUMINESCENCE DEVICE

TECHNICAL FIELD

The present invention relates to methods for manufacturing organic electroluminescence devices and organic electroluminescence devices.

BACKGROUND ART

Conventionally, in an organic EL device having an organic electroluminescence (hereinafter referred to as organic EL) device composed of an anode, a cathode, and an organic layer between the anode and the cathode, there is a technique for repairing (fixing) a shorted part when the anode and the cathode are shorted, by irradiating the shorted part with the laser (for example, see the patent literatures 1 to 3).

In the patent literature 1, a conductive foreign material attached to the organic EL device is detected, and the organic layer in a region around the foreign material is irradiated with the laser. With this, the organic layer of the organic EL device between the anode and the cathode is insulated so as to form a high resistance region which fixes the short between the anode and the cathode by the foreign material.

In the patent literature 2, a part shorted by the foreign material is irradiated with the laser before forming a protective film above the anode and the cathode. With this, the short between the anode and the cathode is fixed by melting the foreign material itself for changing its shape or burning the foreign material itself.

In the patent literature 3, the short between the anode and the cathode due to a foreign material is fixed by cutting the cathode in a part where the anode and the cathode are shorted by the foreign material from the cathode in a non-shorted part so as to physically separate the parts.

In the patent literature 4, the short is fixed by forming a missing part by irradiating a part of the organic EL device where a bright point is missing with a laser beam such as a femtosecond laser so as to form a missing part.

CITATION LIST

Patent Literature

[Patent Literature 1] Japanese Unexamined Patent Application Publication No. 2004-227852
[Patent Literature 2] Japanese Unexamined Patent Application Publication No. 2003-178871
[Patent Literature 3] Japanese Unexamined Patent Application Publication No. 2005-276600
[Patent Literature 4] Japanese Unexamined Patent Application Publication No. 2008-235177

SUMMARY OF INVENTION

Technical Problem

As illustrated in the patent literature 1, a method for fixing the short between the anode and the cathode by insulating the organic layer around the foreign material by irradiating the organic layer with the laser insulates the organic layer around the foreign material. Accordingly, this method is effective for fixing the short when the size of the foreign material is smaller than the thickness of the organic layer. However, if the size of the foreign material is greater than the thickness of the organic layer, there is a problem that it is difficult to fix the short between the anode and the cathode.

Furthermore, as illustrated in the patent literature 2, there is a method for breaking the foreign material by directly irradiating the foreign material with the laser. However, there is a possibility that the foreign material irradiated with the laser absorbs the energy of the laser and shakes, resulting in the breakage of the anode and the cathode of the organic EL device, and damaging the entire panel due to degradation caused by exposure of the light-emitting layer and the cathode to oxygen and moisture from the broken part.

Furthermore, as illustrated in the patent literature 3, in a method for physically separating the short by cutting a part around the short between the anode and the cathode with the laser, the organic layer in the isolated region around the foreign material does not emit light, resulting in a dark spot. In addition, there is a possibility that the entire panel is damaged.

Furthermore, as illustrated in the patent literature 4, in a method for fixing the short by forming the missing part, there may be an extensive damage to a part around the missing part when forming the missing part by the laser irradiation.

In view of the problems, it is an object of the present invention to provide a method for manufacturing the organic electroluminescence device capable of suppressing the damage caused by the laser irradiation as much as possible and securely fixes the short between the anode and the cathode, and the organic electroluminescence device.

Solution to Problem

In order to solve the problem, the method for manufacturing the organic electroluminescence device according to an aspect of the present invention includes: preparing an organic electroluminescence device including a lower electrode, an organic layer including a light-emitting layer, and an upper electrode and having a part in which the lower electrode and the upper electrode are shorted, at least one of the lower electrode and the upper electrode being made of a transparent conductive material; and irradiating the transparent conductive material in at least one of the part where the lower electrode and the upper electrode are shorted and a part around the shorted part with a femtosecond laser, and increasing resistance by changing a structure of the transparent conductive material.

Advantageous Effects of Invention

According to the method for manufacturing the organic electroluminescence device and the organic electroluminescence device according to the present invention, the short between the anode and the cathode can be securely fixed while suppressing the damage caused by the laser irradiation to the maximum extent.

DESCRIPTION OF EMBODIMENTS

Figure 1:
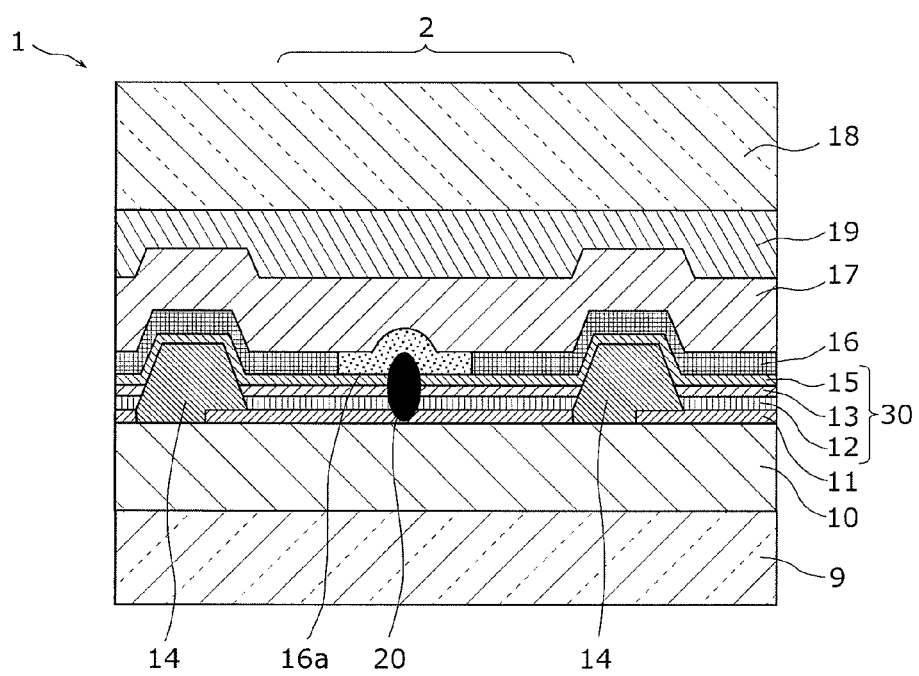
FIG. 1 is a cross-sectional schematic view of an organic EL device according to the embodiment 1.

The method for manufacturing the organic electroluminescence device according to the present invention includes preparing an organic electroluminescence device including a lower electrode, an organic layer including a light-emitting layer, and an upper electrode and having a part in which the lower electrode and the upper electrode are shorted, at least one of the lower electrode and the upper electrode being made of a transparent conductive material; and irradiating the transparent conductive material in at least one of the part where the lower electrode and the upper electrode are shorted and a part around the shorted part with a femtosecond laser, and increasing resistance by changing a structure of the transparent conductive material. Here, the short not only includes a state in which the lower electrode and the upper electrode are completely conducted, but also a state in which the resistance between the lower electrode and the upper electrode is smaller than the other part, making the current likely to flow.

According to this aspect, by changing the structure of the material composing at least one of the electrode at the shorted part or the periphery of the shorted part, the resistance in the part of the lower electrode or the upper electrode can be increased. With this, it is possible to fix the short, the voltage is applied to the organic layer between the anode and the cathode, recovering the light-emission of the pixel including the anode, the organic layer, and the cathode. Furthermore, according to this aspect, instead of physically changing the form of the electrode by cutting the electrode in the shorted part and forming a missing part in the electrode, the structure of the material composing the electrode is merely changed. Accordingly, it is possible to suppress the damage caused at the time of laser irradiation in the part other than the part that requires repair. Furthermore, the part with increased resistance does not conduct over time, not resulting in a short-circuit malfunction. Accordingly, the short is unfailingly fixed. Furthermore, the femtosecond laser is used as the laser used for irradiation. Accordingly, it is possible to change the structure of the transparent conductive material which cannot be easily processed with another laser, so as to increase the resistance.

In addition, when irradiating the transparent conductive material with the femtosecond laser, it is preferable that the structure of the transparent conductive material is changed to a granular structure. Furthermore, it is preferable that a grain size of particles composing the granular structure is in a range from 10 to 500 nm.

According to this aspect, the structure of the transparent conductive material is a granular structure composed of particles having a grain size from 10 to 500 nm. Accordingly, the gap is present between particles composing the structure, which allows a secure increase of the resistance.

In addition, it is preferable that a wavelength of the femtosecond laser is in a range from 900 to 2500 nm.

According to this aspect, the wavelength of the laser to be used is 900 nm to 2500 nm, and the color filters transmit the laser beam. Accordingly, it is possible to fix the short through the color filters.

In addition, it is preferable that the transparent conductive material is a transparent metal oxide.

According to this aspect, the electrode is composed of a transparent metal oxide. Accordingly, it is possible to securely change the structure and increase the resistance by laser irradiation.

In addition, it is preferable that the transparent conductive material before being irradiated with the femtosecond laser is in an amorphous state.

According to this aspect, by the irradiation of the femtosecond laser, the structure of the material composing the anode or the cathode in the amorphous state allows increasing the resistance easily.

In addition, it is preferable that a thickness of the lower electrode or the upper electrode made of the transparent conductive material is in a range from 10 to 40 nm.

According to this aspect, the thickness of the electrode is 10 to 40 nm. Accordingly, it is possible to secure resistance sufficiently high for fixing the short after the change in the structure.

In addition, it is preferable that forming a protective layer above the upper electrode is included before irradiating the transparent conductive material with the femtosecond laser, in which when irradiating the transparent conductive material with the femtosecond laser, the transparent conductive material of at least one of the shorted part and the part around the shorted part is irradiated with the femtosecond laser via the protective layer.

According to this aspect, even in the organic EL device in which the protective layer such as transparent glass is formed, the short can be easily fixed after assembled into a panel.

Since the dark spot malfunction of the shorted pixel is fixed after assembled into a panel, it is possible to improve the yield of the organic EL device.

In addition, the shorted part may include a conductive foreign material in the organic layer.

According to this aspect, the short in the following cases is fixed: when the anode and the cathode is shorted by the conductive foreign material, that is, when the anode and the cathode are directly in contact with each other due to the conductive foreign material, and when the current is likely to flow due to a short distance between the conductive material and the anode or the conductive foreign material and the cathode.

In addition, detecting the conductive foreign material may further be included, in which the transparent conductive material around the conductive foreign material is irradiated with the laser.

When the foreign material is irradiated with the laser, the foreign material absorbs the energy of the laser and shakes, and there is a possibility that the pixel including the organic EL device is damaged. However, according to this aspect, the part around the foreign material is irradiated with the laser, and the short can be fixed without damaging the pixel.

In addition, a thickness of the organic layer in the shorted part may be smaller than a thickness of the organic layer in a part other than the shorted part.

According to this aspect, the short in the following case can be fixed: when the anode and the cathode are directly in contact with each other due to a pin hole formed in the process for forming the organic EL device, or when the current is likely to flow due to the proximity between the anode and the cathode caused by a thin organic layer.

Furthermore, the organic electroluminescence device according to the present invention including a lower electrode; an organic layer including a light-emitting layer; and an upper electrode, in which at least one of the lower electrode and the upper electrode is made of a transparent conductive material, and a part of the transparent conductive material has a structure changed by laser irradiation to have higher resistance. The part of the transparent conductive material is preferably changed to a granular structure. In addition, a conductive foreign material may be present in the proximity of the part of the transparent conductive material.

According to this aspect, the short is securely fixed without the part having increased resistance conducted again over time.

A method for manufacturing an organic EL device and the organic EL device according to the embodiments of the present invention shall be described with reference to the drawings. Note that, in the following description, elements that are same or corresponding over all of the drawings are assigned with the same reference numerals, and overlapping description shall be omitted.

(Embodiment) 1

The embodiment 1 according to the present invention shall be described with reference to the drawings.

FIG. 1 is a cross-sectional schematic view of an organic EL device 1 manufactured by a method for manufacturing the organic EL device according to the embodiment. The organic EL device 1 in FIG. 1 is an organic functional device having an organic layer including an anode, a cathode, and a light-emitting layer interposed between the anode and the cathode.

As illustrated in FIG. 1, the organic EL device 1 includes a planarizing film 10, an anode 11, a hole injection layer 12, a light-emitting layer 13, a bank 14, a hole injection layer 15, a cathode 16, a thin film encapsulating layer 17, an encapsulating resin layer 19, and a transparent glass 18. The anode 11 and the cathode 16 correspond to the lower electrode and the upper electrode according to the present invention, respectively. The hole injection layer 12, the light-emitting layer 13, and the electron injection layer 15 correspond to the organic layer according to the present invention.

The transparent glasses 9 and 18 are substrates for protecting a light-emitting surface of the light-emitting panel, and each is a transparent alkali-free glass having a thickness of 0.5 mm, for example.

The planarizing film 10 is made of an insulating organic material, for example, and is formed on a substrate including thin-film transistors (TFT) for driving.

The anode 11 is an electrode where holes are supplied, that is, current flows in from an external circuit, and has a structure in which a reflective electrode made of Al or silver alloy APC stacked on the planarizing film 10. The thickness of the reflective electrode is 10 to 40 nm, for example. Note that, the anode 11 may have a two-layered structure including indium tin oxide (ITO), silver alloy APC, and others.

The hole injection layer 12 is a layer having a hole injecting material as the main component. The hole injecting material is a material having function for stably injecting holes injected from the side of the anode 11 into the light-emitting layer 13. The hole injecting material also supports generation of the holes. For example, compounds such as poly(3,4-ethylenedioxythiophene), aniline, and others are used.

The light-emitting layer 13 is a layer which emits light by voltage applied between the anode 11 and the cathode 16, and has a structure in which α-NPD(Bis[N-(1-naphthyl)-N-phenyl]benzidine) is stacked as the lower layer and Alq3(tris-(8-hydroxyquinoline)aluminum) is stacked as the upper layer.

The electron injection layer 15 is a layer having an electron injecting material as the main component. The electron injecting material is a material having function for stably injecting electrons injected from the side of the anode 11 into the light-emitting layer 13. The electron injecting material also supports generation of the electrons. For example, polyphenylene vinylene (PPV) is used The cathode 16 is an electrode where electrons are supplied, that is, current flows toward the external circuit, and has a stacked structure of ITO which is a transparent metal oxide, for example. The cathode 16 may be formed as a transparent electrode by a material such as Mg, Ag, or others. The thickness of the electrode is 10 to 40 nm, for example.

The bank 14 is a wall for separating the light-emitting layer 13 into multiple light-emitting regions, and is made of a photosensitive resin, for example.

The thin-film encapsulating layer 17 is made of silicon nitride, for example, and has function of blocking the light-emitting layer 13 and the cathode 16 from moisture and oxygen. This is for preventing degradation (oxidation) of the light-emitting layer 13 itself or the cathode 16 due to exposure to moisture and oxygen.

The encapsulating resin layer 19 is acrylic or epoxy resin, and has a function of joining an integral layer from the planarizing film 10 to the thin-film encapsulating layer 17 and the transparent glass 18.

The configuration including the anode 11, the light-emitting layer 13, and the cathode 16 is the basic configuration of the organic EL device. With this configuration, when appropriate voltage is applied between the anode 11 and the cathode 16, holes are injected into the light-emitting layer 13 from the side of the anode 11, and the electrons are injected into the light-emitting layer 13 from the side of the cathode 16. The energy generated by the recombination of the injected holes and electrons in the light-emitting layer 13 excites the light-emitting material in the light-emitting layer 13 to emit light.

Note that, the materials for the hole injection layer 12 and the electron injection layer 15 are not limited by the present invention, and known organic materials or inorganic materials are used.

As alternatives to the configuration of the organic EL device 1, a hole transport layer may be present between the hole injection layer 12 and the light-emitting layer 13, and an electron transport layer may be present between the electron injection layer 15 and the light-emitting layer 13. The hole transport layer is a layer having a hole transporting material as the main component. The hole transporting material is a material having electron donor property susceptible to become positive ions (holes) and property for transmitting the generated holes by electron transfer between molecules, and is suitable for the charge transfer from the anode 11 to the light-emitting layer 13. The electron transport layer is a layer having an electron transporting material as the main component. The electron transporting material is a material having electron acceptor property susceptible to become negative ions and property for transmitting the generated electrons by electron transfer between molecules, and suitable for the charge transfer from the cathode 16 to the light-emitting layer 13.

The organic EL device 1 may further include a color filters for adjusting colors in red, green, and blue under the transparent glass 18 so as to cover the light-emitting regions separated by the bank 14.

Note that, in the present invention, the hole injection layer 12, the light-emitting layer 13, and the electron injection layer 15 are collectively referred to as an organic layer 30. Furthermore, when the hole transport layer and the electron transport layer are included, these layers are included in the organic layer 30 as well. The thickness of the organic layer 30 is from 100 to 200 nm, for example. The pixel 2 refers to the planarizing film 10, the anode 11, the organic layer 30, the cathode 16, the thin-film encapsulating layer 17, and the transparent glass 18 arranged in the light-emitting region isolated by the bank 14.

Furthermore, the organic EL device 1 illustrated in FIG. 1 includes a conductive foreign material 20 between the anode 11 and the cathode 16 entered during the manufacturing process, and the anode 11 and the cathode 16 are shorted through the foreign material 20. By changing the structure of ITO composing a part 16a of the cathode 16 above a position where the foreign material 20 is present so as to change the resistance, the short between the anode 11 and the cathode 16 by the foreign material 20 is fixed (repaired). The process for repairing the shorted part shall be described later.

Next, the method for manufacturing the organic EL device 1 shall be described.

Figure 2:
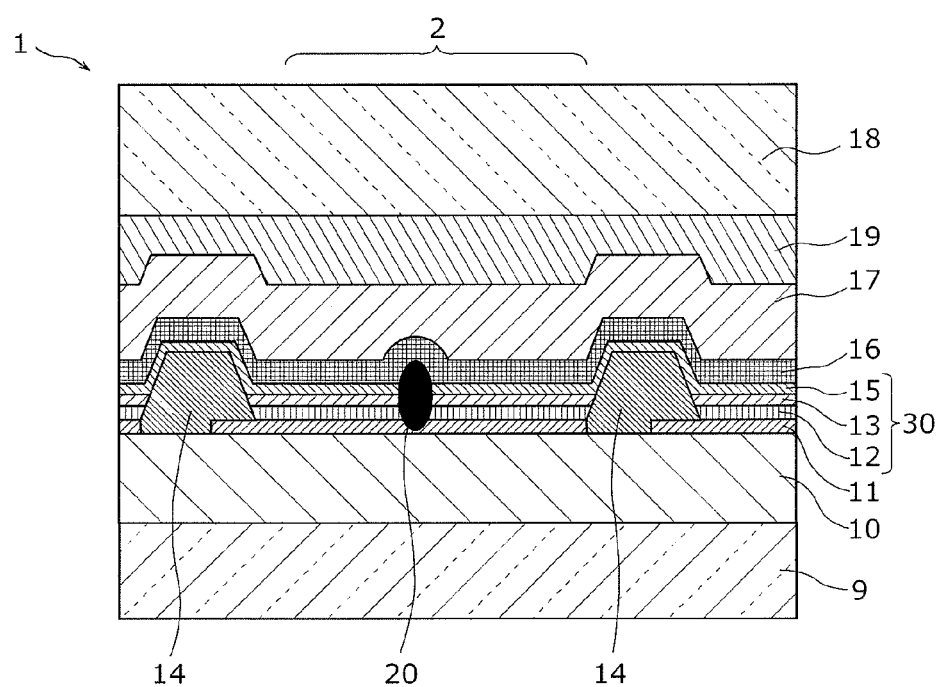
FIG. 2 is a cross-sectional schematic view of a shorted organic EL device.

First, the process for forming the organic EL device shall be described. FIG. 2 is a cross-sectional schematic view of an organic EL device prepared in the first process of the present invention, and illustrates a cross-sectional structure of the shorted organic EL device. First, the planarizing film 10 made of insulating organic material is formed, and the anode 11 is formed on the planarizing film 10.

The anode 11 is formed by forming Al for 30 nm by sputtering on the planarizing film 10, and by patterning including photolithography and wet etching.

The hole injection layer 12 is formed by solving PEDOT by a solvent made of xylene and spin coating the PEDOT solution.

Next, α-NPD and Alq3 are stacked by vapor deposition, for example, and the light-emitting layer 13 is formed.

After that, the electron injection layer 15 is formed by spin coating a solution including polyphenylene vinylene (PPV) solved by solvent made of chloroform.

Subsequently, the cathode 16 is formed without exposing the substrate on which the electron injection layer 15 is formed to the air. More specifically, the cathode 16 is formed by stacking ITO for 35 nm by sputtering on the electron injection layer 15. Here, the cathode 16 is in the amorphous state.

The organic EL device having a function as the light-emitting device is formed by the manufacturing process described above. Note that, the bank 14 made of photosensitive resin on a surface is formed at a predetermined position between the process for forming the anode 11 and the hole injection layer 12.

Next, the thin-film encapsulating layer 17 is formed by stacking silicon nitride for 500 nm on the cathode 16 by the plasma CVD, for example. The thin-film encapsulating layer 17 is formed in contact with the surface of the cathode 16. Accordingly, it is preferable to raise the requirement as the protective film, and a non-oxygen series inorganic material represented by silicon nitride described above is preferable. Furthermore, for example, the configuration may include oxygen series inorganic material such as silicon oxide ($Si_XO_Y$) or silicon oxynitride ($Si_XO_YN_Z$) or multiple layers of inorganic materials. Furthermore, the forming method may not be limited to the plasma CVD, but may be another method such as sputtering using argon plasma.

Next, the encapsulating resin layer 19 is applied on the surface of the thin-film sealing layer 17. Subsequently, the transparent glass 18 is placed on the encapsulating resin layer 19 applied. Here, in the case of the organic EL device 1 including color filters, the color filters are formed on the main surface of the transparent glass 18 in advance. Subsequently, the transparent glass 18 is placed on the encapsulating resin layer 19 applied with the surface on which the color filters are formed facing downward. Note that, the thin-film encapsulating layer 17, the encapsulating resin layer 19, and the transparent glass 18 correspond to the protective layer according to the present invention.

Finally, the transparent glass 18 is pressed downward from the upper surface side, and heat or energy line is applied so as to cure the encapsulating resin layer 19, bonding the transparent glass 18 and the thin-film sealing layer 17.

The organic EL device 1 illustrated in FIG. 2 is formed by the forming method described above.

Note that, the forming process of the anode 11, the hole injection layer 12, the light-emitting layer 13, the electron injection layer 15, the cathode 16 is not limited by the present invention.

FIG. 2 is a cross-sectional schematic view of the organic EL device 1 in which the conductive foreign material 20 is present between the anode 11 and the cathode 16, and the anode 11 and the cathode 16 are shorted through the foreign material 20. The foreign material 20 is formed by Al which is the material for the anode 11 is adhered to the anode 11 after the anode 11 is formed, and the hole injection layer 12, the light-emitting layer 13, the electron injection layer 15, and the cathode 16 are stacked afterward. The size of the foreign material 20 is approximately 200 nm in diameter and 500 nm in height, for example. Since the anode 11 and the cathode 16 are shorted by the foreign material 20, the organic EL device does not emit light in the pixel 2, and becomes a dark spot pixel.

Figure 3:
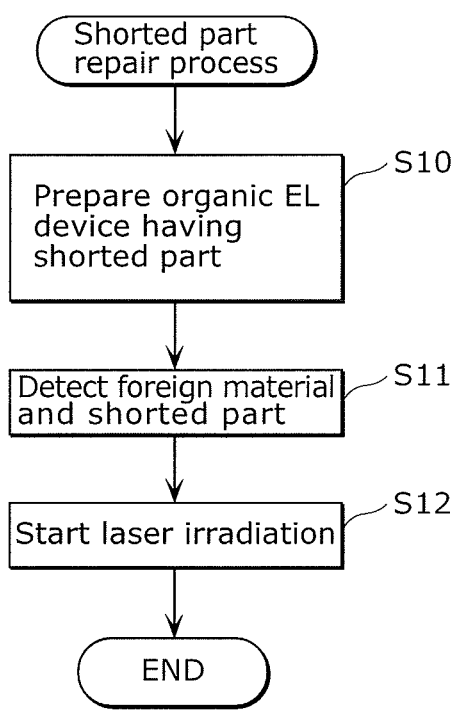
FIG. 3 is a flowchart illustrating a process in a method for manufacturing an organic EL device according to the present invention.

Next, with regard to the organic EL device 1 in which the anode 11 and the cathode 16 are shorted by the foreign material 20 described above, a process for repairing the shorted part shall be described. FIG. 3 is a flowchart illustrating a process for fixing the short in the organic EL device.

The shorted part is repaired by irradiating the cathode 16 with the laser through the transparent glass 18. More specifically, an organic EL device having a shorted part is prepared (step S10), a part shorted by the foreign material 20 and the foreign material 20 present is detected (step S11), and irradiation of the laser on the cathode 16 at a part above the shorted part in the pixel 2 from the side of the transparent glass 18 is started (step S12). With this, the structure of ITO composing a part of the cathode 16 irradiated with the laser is changed into granular structure so as to increase the resistance. With this, the short between the anode 11 and the cathode 16 is fixed.

The part where the anode 11 and the cathode 16 are shorted or the foreign material 20 is visually detected by detecting a pixel having luminance lower than the light-emission luminance of a regular pixel after a luminance signal voltage corresponding to an intermediate luminance tone is provided to each of the pixels 2, for example. Note that, the method for detecting the shorted part or the foreign material 20 is not limited to the method described above and the detection may be performed by measuring a current value flowing between the anode 11 and the cathode 16 of the organic EL device, according to a current value. In this case, when forward-bias voltage is applied, a current value equivalent to the regular pixel is obtained, and when reverse-bias voltage is applied, leakage light emission is observed at a part. This part may be determined as a shorted part or a part where the foreign material 20 is present.

Figure 4A:
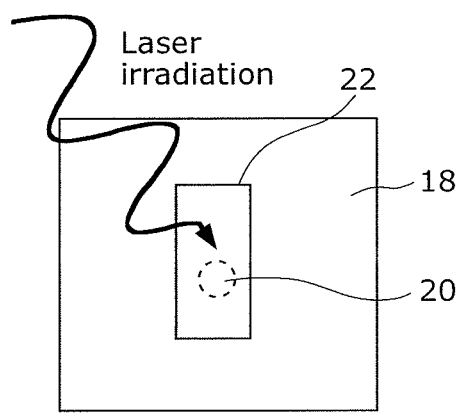
FIG. 4A is a top view of an organic EL device for illustrating a position where the laser is irradiated.
Figure 4B:
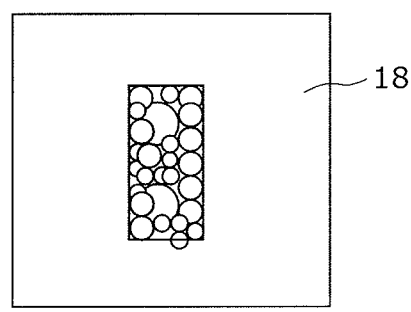
FIG. 4B is a top view of an organic EL device for illustrating a position where the laser is irradiated.
Figure 5:
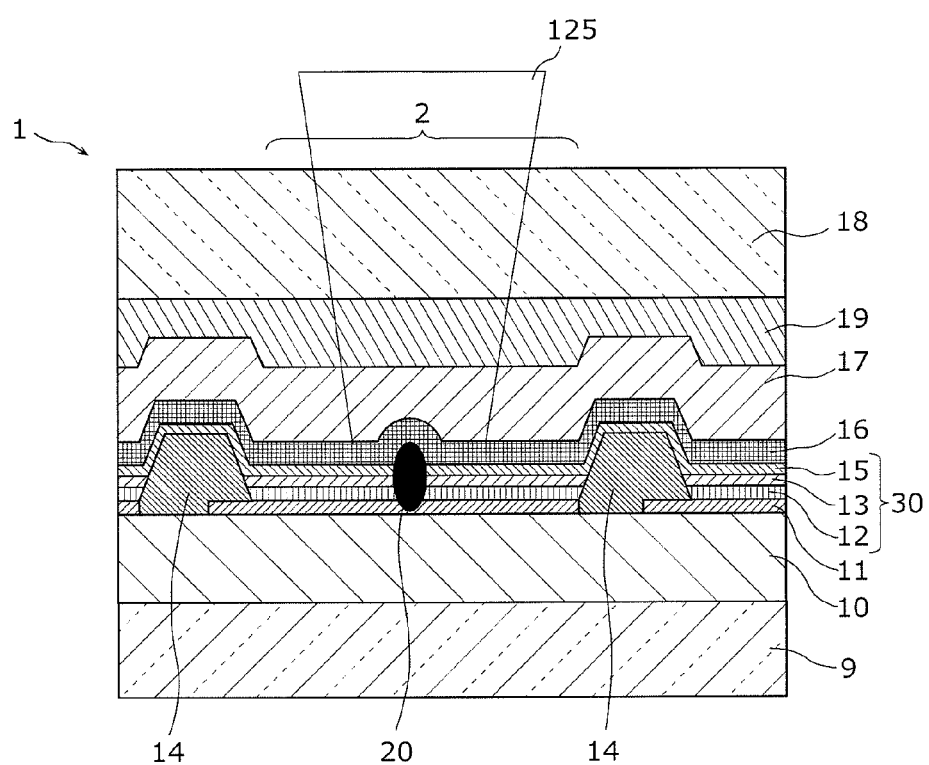
FIG. 5 is a cross-sectional schematic view illustrating a process for repairing the shorted part in an organic EL device.
Figure 6:
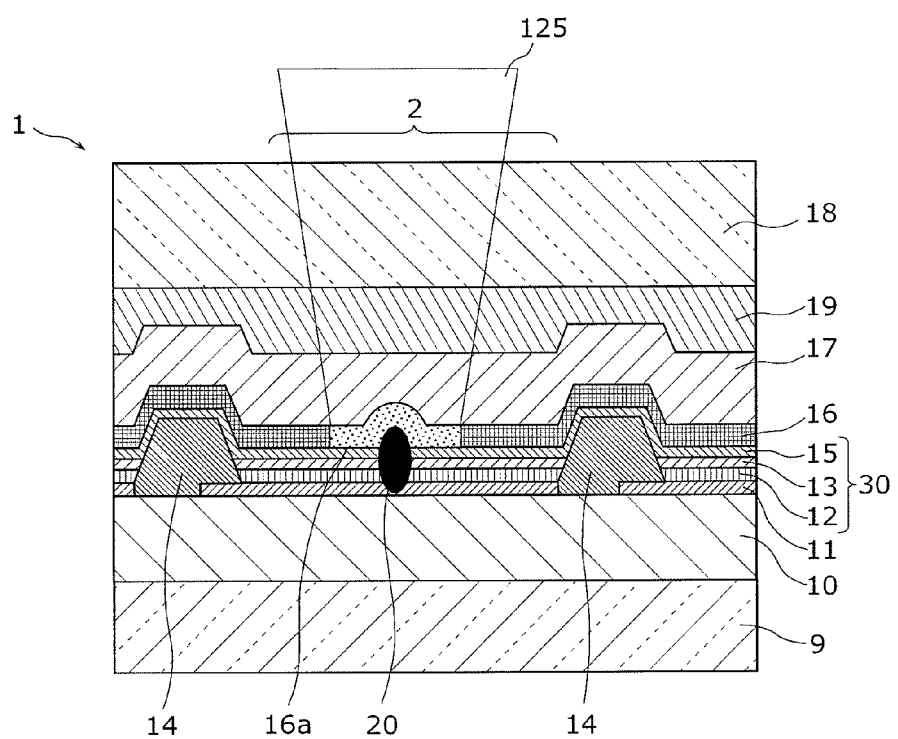
FIG. 6 is a cross-sectional schematic view illustrating a process for repairing the shorted part in an organic EL device.

FIG. 4A and FIG. 4B are top views of the organic EL device 1 for illustrating a region where the laser for the foreign material 20 is to be irradiated. FIG. 4A is before the irradiation of the laser 125, and FIG. 4B is a top view of the organic EL device 1 after the irradiation of the laser 125. In FIG. 4A and FIG. 4B, the region 22 surrounded by the solid line is a range where the laser is to be irradiated. FIG. 5 and FIG. 6 are schematic diagrams indicating a process for fixing the short in the organic EL device 1. FIG. 5 is before the irradiation of the laser 125, and FIG. 6 is a cross-sectional schematic view of the organic EL device 1 after the laser irradiation of the laser 125.

After the foreign material 20 is detected, as illustrated in FIG. 4A and FIG. 5, the region 22 of 5 μm×10 μm in the cathode 16 at a part where the anode 11 and the cathode 16 are shorted by the foreign material 20 and the periphery of the part is irradiated with the laser 125. Note that, the focus of the laser 125 is adjusted to the cathode 16.

In the region 22 irradiated with the laser 125, the structure of the cathode 16 changes from the amorphous state to a granular structure. Here, the granular structure refers to a structure in which multiple particles aggregate with gap remaining between particles. The grain size of the particles composing the granular structure is 10 to 500 nm, for example. The shape of particles may be spherical or in flakes. In the part 16a in the cathode having the granular structure, there is gap between particles. It is assumed that this gap increases the resistance because the part 16a of the cathode having the granular structure is less likely to cause the current to flow compared to the cathode 16 at a part not having the granular structure. The resistance value (resistivity) of the cathode 16 not having the granular structure is 50Ω, and the part 16a of the cathode having the granular structure is 40MΩ, for example. As described above, by increasing the resistance at the region 22 of the cathode 16, the short in the region 22 between the anode 11 and the cathode 16 is fixed, recovering the light emission of the pixel 2.

Here, the type of the laser 125 to be irradiated is a femtosecond laser having output energy of 1 to 30 μJ and a pulse width of a few hundred femtoseconds. The wavelength of the laser is 900 to 2500 nm, for example.

Figure 7A:
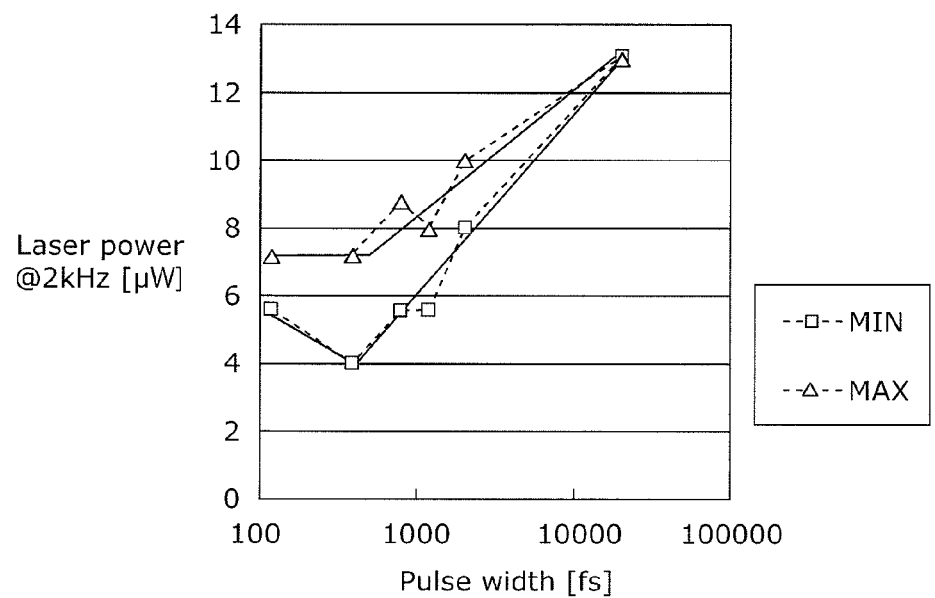
FIG. 7A illustrates a relationship between the laser power and the pulse width of the laser.
Figure 7B:
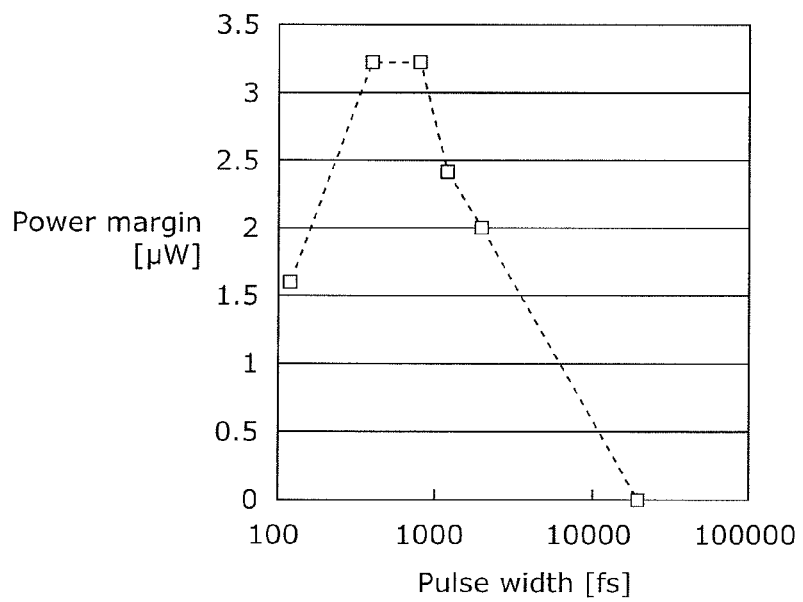
FIG. 7B illustrates a relationship between the laser power and the pulse width of the laser.

FIG. 7A and FIG. 7B are graphs illustrating a relationship between the pulse width and the laser power of the laser 125. FIG. 7A illustrates the maximum value and the minimum value of the laser power with respect to the pulse width necessary for changing the structure of the cathode 16 into the granular structure. In FIG. 7A, the laser power on the surface of the organic EL device 1 when the laser 125 having the oscillation frequency of 2 kHz. Furthermore, FIG. 7B illustrates the difference between the maximum value and the minimum value of the laser power with respect to the pulse width illustrated in FIG. 7A.

In FIG. 7A, the broken line with white triangles represents the maximum value (MAX) of the laser power necessary for changing the structure of the cathode 16 into the granular structure. In FIG. 7A, the broken line with white squares represents the maximum value (MIN) of the laser power necessary for changing the structure of the cathode 16 into the granular structure. The solid lines represent approximate values of MAX and MIN of the laser power.

When the cathode 16 is irradiated with the laser having a laser power larger than the MAX of the laser power, the laser reaches the organic layer 30 provided under the cathode 16 in the organic EL device, damaging the organic layer 30. Furthermore, when the cathode 16 is irradiated with a laser having a laser power smaller than the MIN of the laser power, the cathode 16 is not changed to the granular structure. Furthermore, when the cathode 16 is irradiated with a laser having a pulse width of equal to or larger than 20000 fs, the organic layer 30 is damaged. Accordingly, it is preferable that the laser power is adjusted between MAX and MIN of the laser power and to be irradiated with the cathode 16.

Note that, in FIG. 7A, the maximum value of the laser power 13 μW is converted to a laser output energy of 7.5 nJ. The minimum value of the laser power 4 μW is converted to laser output energy of 2 NJ.

Furthermore, as illustrated in FIG. 7B, the power margin increases in a pulse width of the laser of 400 to 800 fs. Accordingly, by irradiating the organic EL device 1 with a femtosecond laser having the pulse width in this range easily allows changing the material of the cathode 16 into the granular structure.

Furthermore, the output energy of the laser 125 is not limited to the range described above, and may have an output energy at a level which changes the cathode 16 into a granular structure and does not break the thin-film sealing layer 17.

The thermal energy of the laser irradiated on the region 22 spreads to a range approximately 1 μm away from the position of the region 22 irradiated with the laser, and the cathode 16 in this range may be changed to the granular structure with increased resistance. The short-circuit between the anode 11 and the cathode 16 is fixed, recovering the light emission of the pixel 2 in this case as well.

Furthermore, the laser irradiation by the laser 125 is not limited to the cathode 16. When the anode is made of a transparent conductive material, the focus of the laser may be adjusted, and the anode 11 may be irradiated with the laser. Furthermore, the laser irradiation may be performed not only from the side of the transparent glass 18, but from the side of the transparent glass 9.

(Embodiment) 2

Next, the embodiment 2 shall be described. In this embodiment, the irradiation region in the organic EL device 50 irradiated with the laser is different from the embodiment 1.

Figure 8:
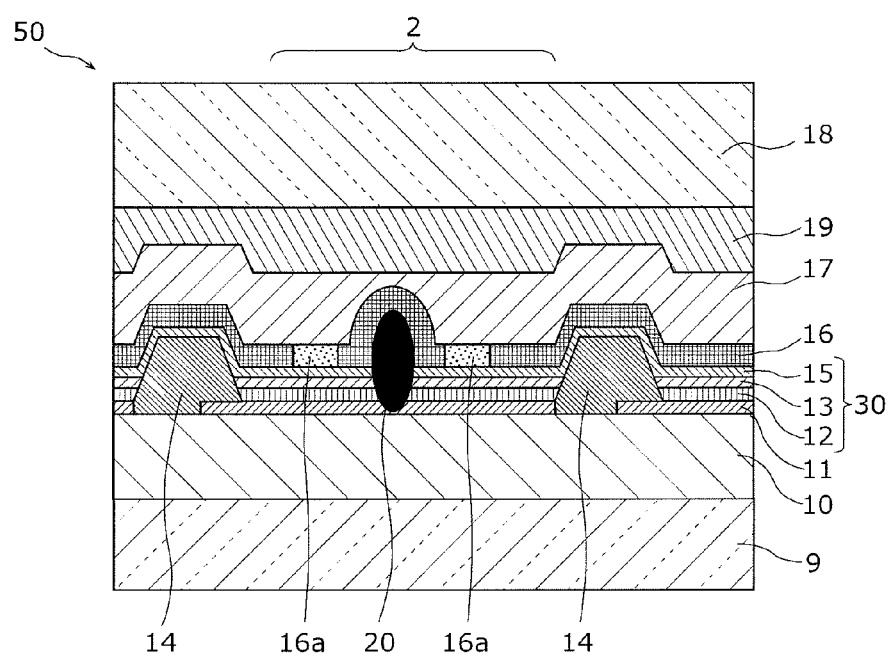
FIG. 8 is a cross-sectional schematic view of an organic EL device according to the embodiment 2.
Figure 9:
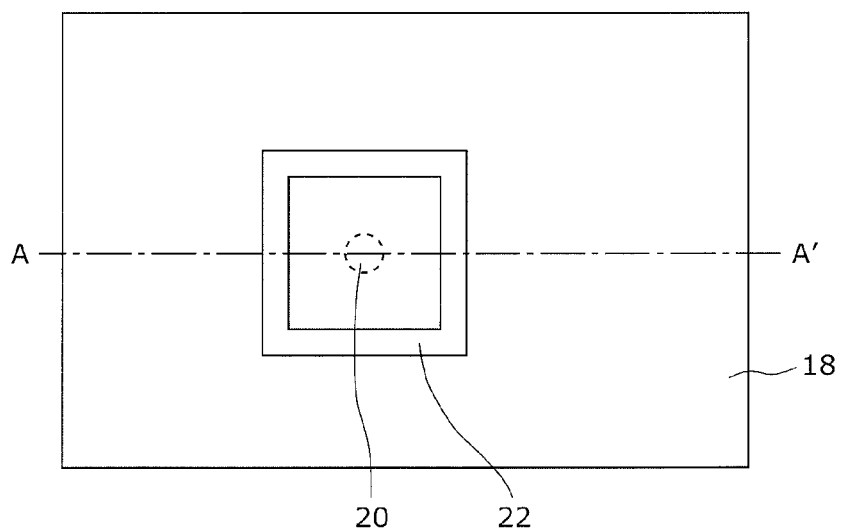
FIG. 9 is a top view of an organic EL device for illustrating a position where the laser is irradiated.
Figure 10:
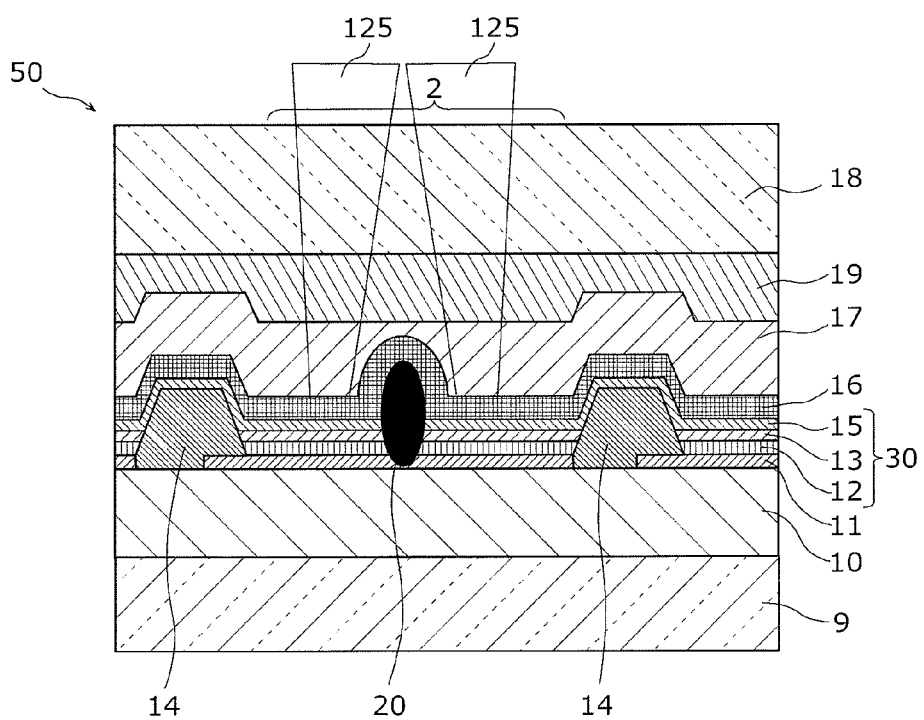
FIG. 10 is a cross-sectional schematic view illustrating a process for repairing the shorted part in an organic EL device.
Figure 11:
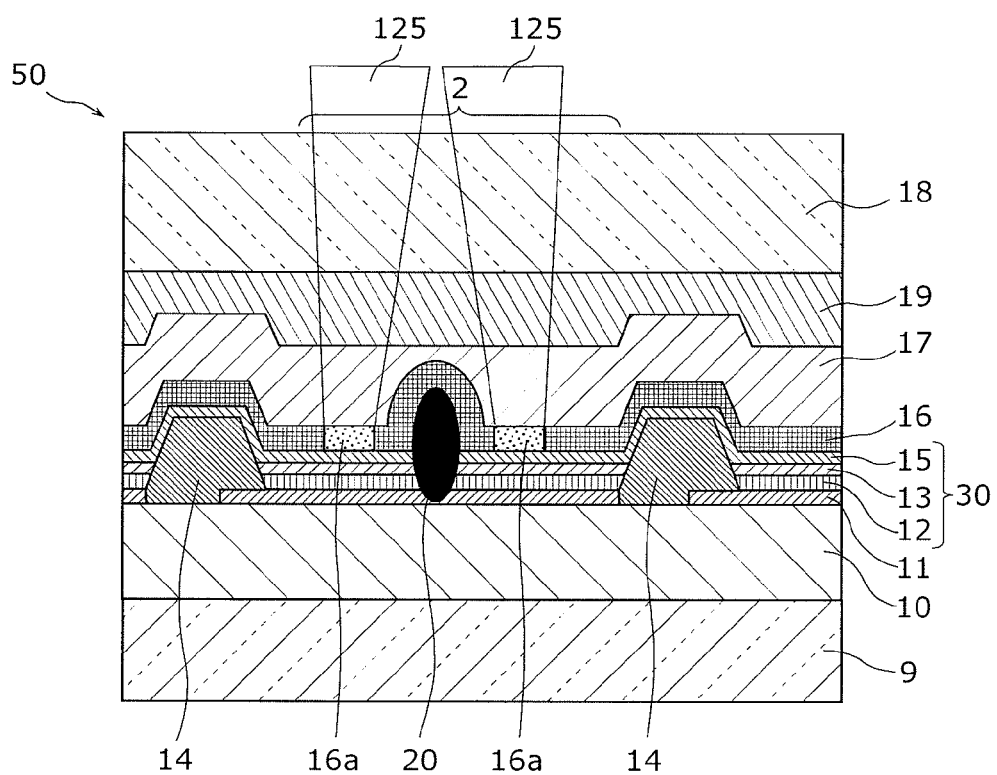
FIG. 11 is a cross-sectional schematic view illustrating a process for repairing the shorted part in an organic EL device.

FIG. 8 is a cross-sectional schematic view of the organic EL device 50 according to the embodiment 2, and is a cross-sectional schematic view of the organic EL device 50 after the part in which the anode 11 and the cathode 16 are shorted is irradiated with the laser. FIG. 9 is a top view of an organic EL device for illustrating a position where the laser is irradiated. FIG. 10 and FIG. 11 are cross-sectional schematic views illustrating a process for fixing the short in the organic EL device 50. FIG. 10 is a cross-sectional schematic view before the organic EL device 50 is irradiated with the laser 125, and FIG. 11 is a cross-sectional schematic view after the organic EL device 50 is irradiated with the laser 125.

As illustrated in FIG. 9 and FIG. 10, in the embodiment, the cathode 16 in the predetermined region around the foreign material 20 is irradiated with the laser 125. For example, as illustrated in FIG. 9, the cathode 16 at a periphery of the foreign material away from approximately 10 μm is irradiated with the laser in a square loop shape of 20 μm×20 μm. As illustrated in FIG. 11, the structure of the part 16a of the cathode is changed to the granular structure when the part 16a is irradiated with the laser 125, fixing the short between the anode 11 and the cathode 16.

As illustrated in the embodiment 1, when the cathode 16 in the predetermined region including the foreign material 20 is irradiated with the laser 125, there is a possibility that the foreign material 20 absorbs the energy of the laser 125 and shakes, causing damage on the pixel 2. In contrast, as illustrated in the embodiment 2, by setting the focus of the laser 125 on the cathode 16 at a part around the foreign material 20 suppresses the energy of the laser 125 from being absorbed by the foreign material 20, changing the structure of the cathode 16 around the foreign material 20 into the granular structure.

Figure 12:
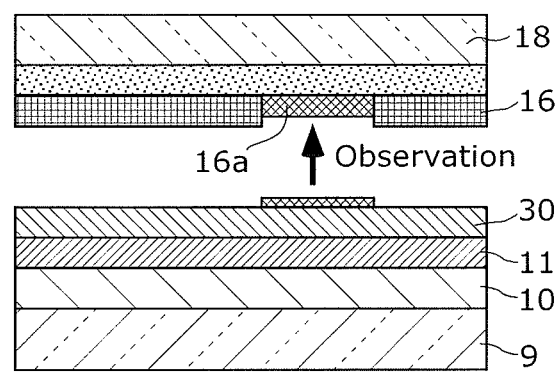
FIG. 12 is a cross-sectional schematic diagram illustrating observation of a state of the surface of a cathode after the structure of the cathode is changed to a granular structure.
Figure 13A:
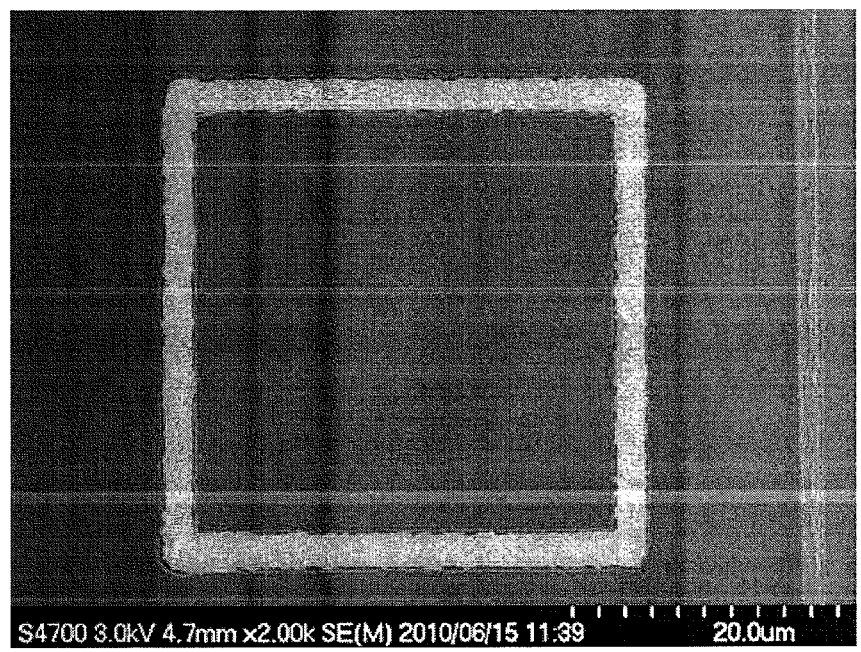
FIG. 13A is an SEM image capturing the state of the surface of the cathode.
Figure 13B:
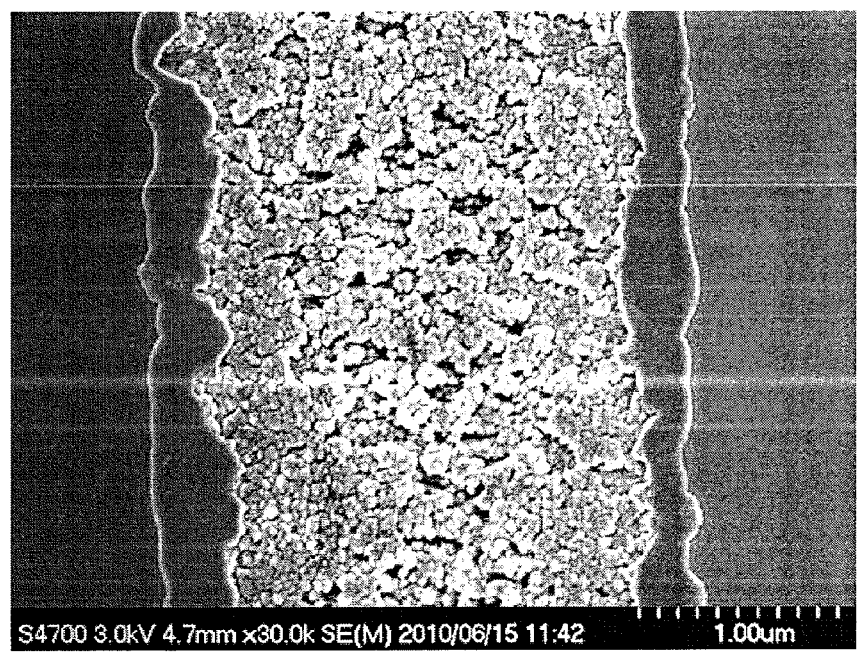
FIG. 13B is an SEM image capturing the state of the surface of the cathode.

FIG. 12 is a cross-sectional schematic view when observing the state of the surface of the cathode 16 after the structure of the cathode 16 made of ITO is changed to the granular structure. FIG. 13A is an SEM image captured by observing a state of the surface of the organic EL device 50 after the short is fixed by the irradiation of the laser 125 by a scanning electron microscope (SEM). FIG. 13B is an SEM image captured by observing the part of FIG. 13A while enlarging the part.

As illustrated in FIG. 13A, the state of the surface of the cathode 16 is observed through SEM after the cathode 16 is irradiated with the laser 125, and the organic EL device 50 is cleaved between the cathode 16 and the organic layer 30. A cleaved surface of the part 16a of the cathode 16a is observed.

As illustrated in FIG. 13A, the change in the structure of the part 16a of the cathode irradiated with the laser 125 in a square shape of 20 μm×20 μm is observed in the organic EL device 50 irradiated with the laser 125. The grain size of the particle composing the granular structure is 10 to 500 nm, for example. Furthermore, as illustrated in FIG. 13B, when the part 16a of the cathode having the granular structure is enlarged and observed under SEM, gap between particles is observed. With this gap, the current is less likely to flow in the part 16a of the cathode changed into the granular structure than the cathode 16 where the structure is not the granular structure, and thus has higher resistance.

As described above, the cathode 16 in a range surrounded by the foreign material 20 where irradiated with the laser has higher resistance by changing into the granular structure. With this, the short-circuit between the anode 11 and the cathode 16 is fixed, recovering the light emission of the pixel 2.

Note that, the type, wavelength, output energy of the laser 25 may be changed any way, as long as the structure of the cathode 16 is changed to the granular structure, and the thin-film encapsulating layer 17 is not broken. Furthermore, in the same manner as the embodiment 1, a process for detecting the position of the foreign material 20 may be provided before the repair process.

(Embodiment) 3

Next, the embodiment 3 according to the present invention shall be described. The embodiment 3 is different from the embodiment 1 in that shorted part in the organic EL device is shorted due to the anode and the cathode being directly in contact without the conductive foreign material intervening in between.

Figure 14:
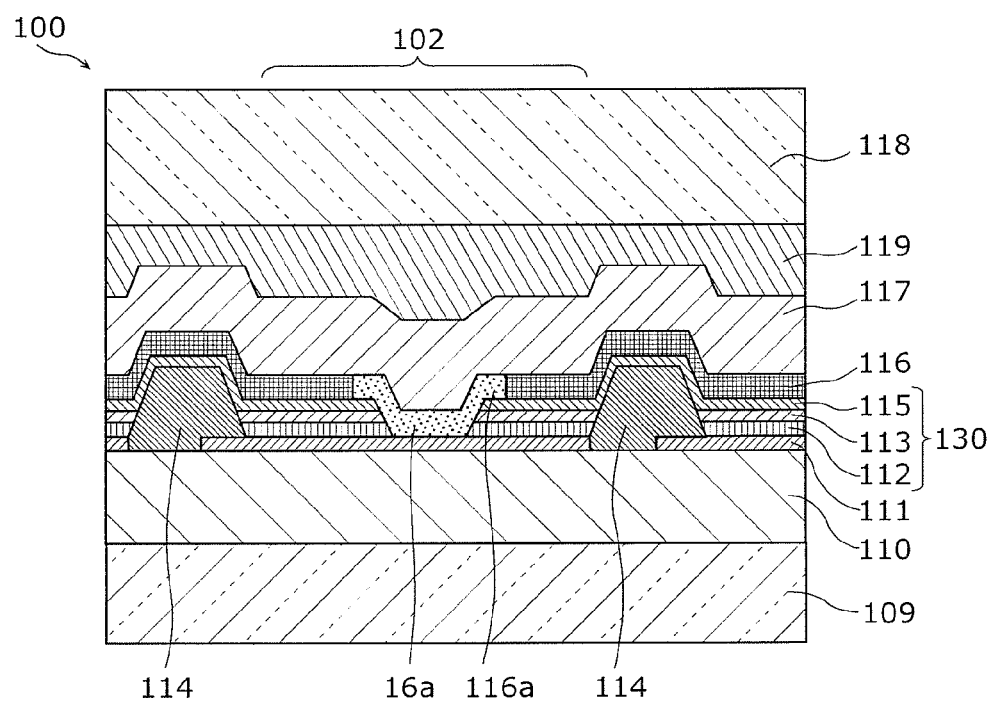
FIG. 14 is a cross-sectional schematic view of an organic EL device according to the embodiment 3.

FIG. 14 is a cross-sectional schematic view of the organic EL device 100 according to the embodiment 3. The organic EL device 100 illustrated in FIG. 14 includes the planarizing film 110, the anode 111, the hole injection layer 112, the light-emitting layer 113, the bank 114, the electron injection layer 115, the cathode 116, the thin-film encapsulating layer 117, the encapsulating resin layer 119, and the transparent glass 118 above the transparent glass 109 in the same manner as the organic EL device 1 illustrated in the embodiment 1. Since the configuration is identical to the embodiment 1, the description shall be omitted. Note that, in the same manner as the embodiment 1, in the embodiment 3, the hole injection layer 112, the light-emitting layer 113, and the electron injection layer 115 are collectively referred to as the organic layer 130. Furthermore, when the hole transport layer and the electron transport layer are included, these layers are included in the organic layer 130 as well. Furthermore, the planarizing film 110, the anode 111, the organic layer 130, the cathode 116, the thin-film sealing layer 117, and the transparent glass 118 arranged in the light-emitting regions separated by the bank 114 are referred to as the pixels 102. Here, in the case of the organic EL device 100 including color filters, the color filters are formed on the main surface of the transparent glass 18 in advance. Subsequently, the transparent glass 118 is placed on the encapsulating resin layer 119 applied with the surface on which the color filters are formed facing downward. Note that, the thin-film encapsulating layer 117, the encapsulating resin layer 119, and the transparent glass 118 correspond to the protective film according to the present invention.

In FIG. 14, the anode 111 and the cathode 116 are directly in contact with each other at a part 116a of the cathode. This direct contact is caused by a pin hole formed at the shorted part 120 in the forming process of the organic layer 130, and the material composing the cathode 116 flows into the pin hole during the forming process of the cathode 116, and the cathode 116 is formed. The direct contact is the result of this process. Subsequently, by increasing the resistance at the part 116a of the cathode, the short between the anode 111 and the cathode 116 is fixed.

Next, the process for fixing the short in the shorted part 120 in which the anode 111 and the cathode 116 are shorted shall be described with reference to FIG. 15 to FIG. 17.

Figure 15:
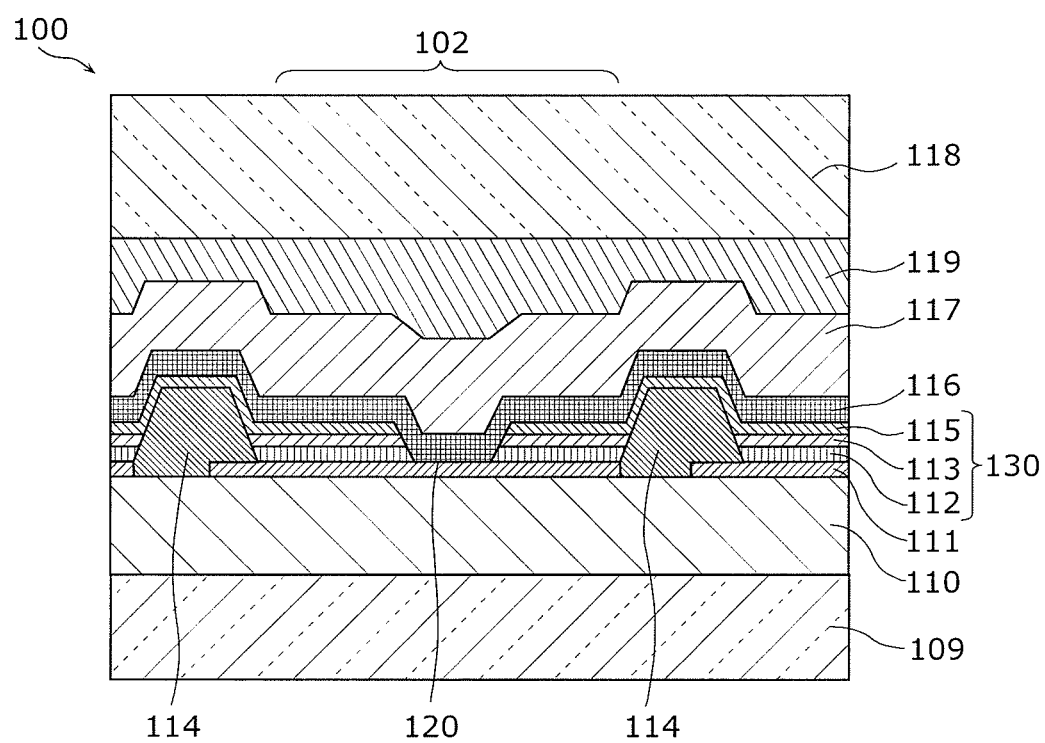
FIG. 15 is a cross-sectional schematic view illustrating a process for repairing the shorted part in an organic EL device.
Figure 16:
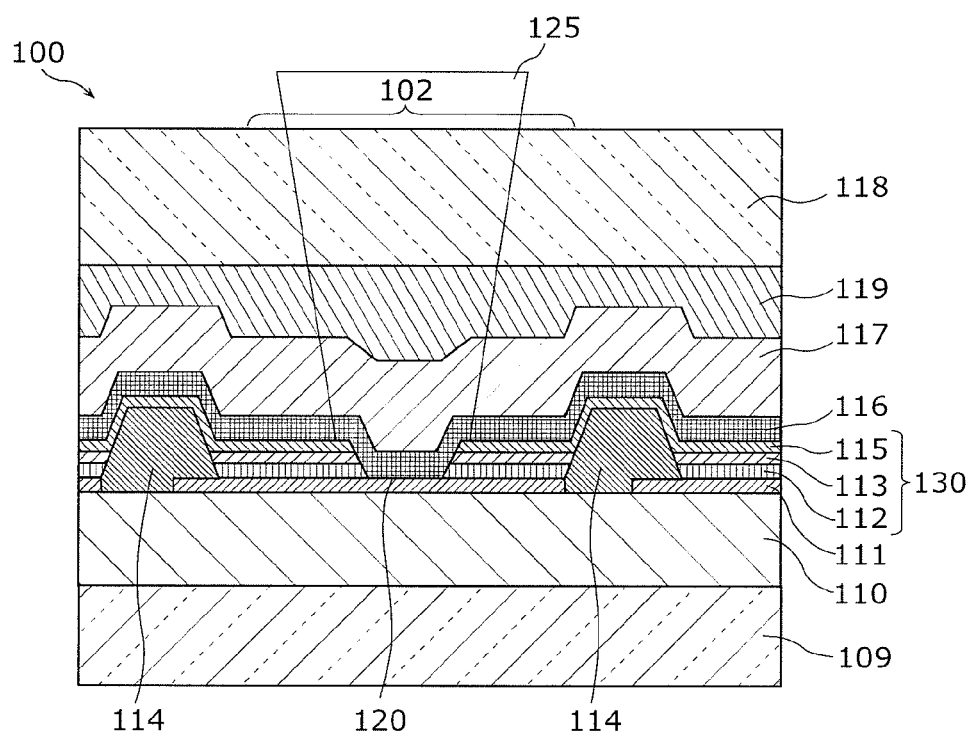
FIG. 16 is a cross-sectional schematic view illustrating a process for repairing the shorted part in an organic EL device.
Figure 17:
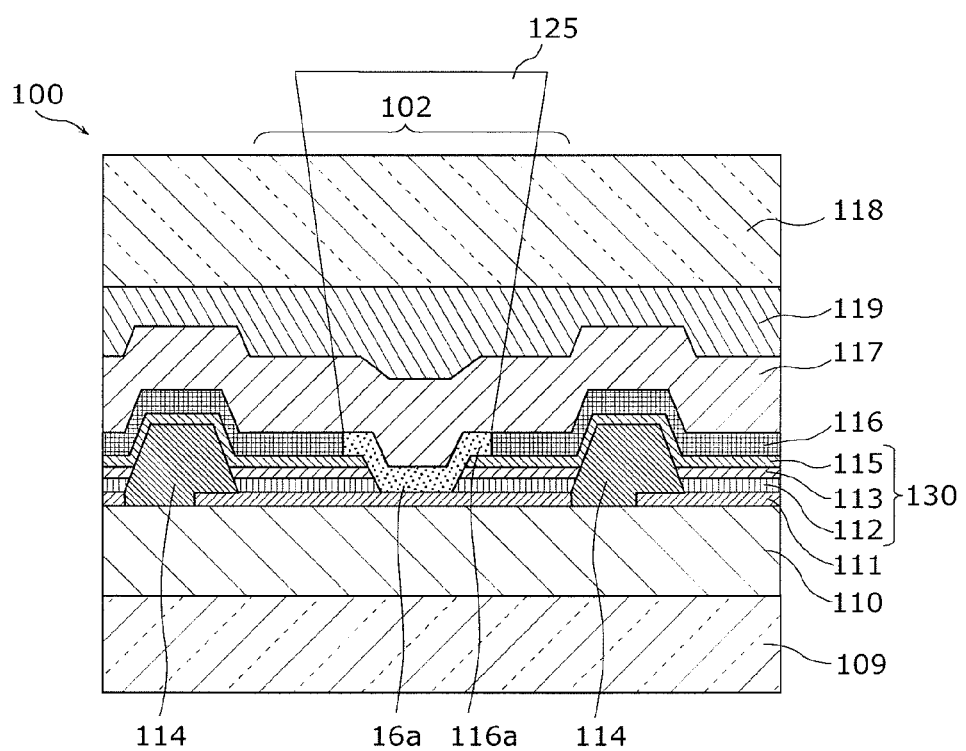
FIG. 17 is a cross-sectional schematic view illustrating a process for repairing the shorted part in an organic EL device.

FIG. 15 to FIG. 17 are cross-sectional schematic views illustrating a process for repairing the shorted part in an organic EL device. FIG. 15 is a cross-sectional schematic view of the organic EL device 100 before repair, FIG. 16 is a cross-sectional schematic view of the organic EL device 100 when irradiated with the laser 125, and FIG. 17 is a cross-sectional schematic view of the organic EL device 100 after repair.

The shorted part 120 is repaired by irradiating the cathode 116 near the shorted part 120 with the laser 125, in the same manner as the embodiment 1. More specifically, in the pixel 102 having the shorted part 120 illustrated in FIG. 15, the cathode 116 near the shorted part 120 is irradiated with the laser from the side of the transparent glass 118, changing the structure of the part of the cathode 116 into a granular structure. In the part 116a of the cathode having the granular structure, there is a gap between particles. With this gap, the current is less likely to flow in the part 116a of the cathode changed into the granular structure than the cathode 116 where the structure is not the granular structure, and thus has higher resistance. As described above, by increasing the resistance of the part of the cathode 116, the short between the anode 111 and the cathode 116 is fixed, recovering the light-emitting by the pixel 102.

Here, the type of the laser 125 to be irradiated is a femtosecond laser having output energy of 1 to 30 µJ and a pulse width of a few hundred femtoseconds. The wavelength of the laser is 900 to 2500 nm, for example.

Alternatively, there is a case where the thermal energy of the laser expands to a predetermined range around the region irradiated with the laser 125, and the cathode 116 in this range is changed to the granular structure, increasing the resistance. The short-circuit between the anode 11 and the cathode 16 is fixed, recovering the light emission of the pixel 2 in this case as well.

Alternatively, a process for detecting the shorted part 120 may be added before the process for repairing the shorted part 120.

(Embodiment) 4

Next, the embodiment 4 according to the present invention shall be described. The embodiment 4 is different from the embodiments 1 to 3 in that the anode 11 and the cathode 16 are not fully conducted, and the resistance between the anode 11 and the cathode 16 is smaller than another part.

Figure 18:
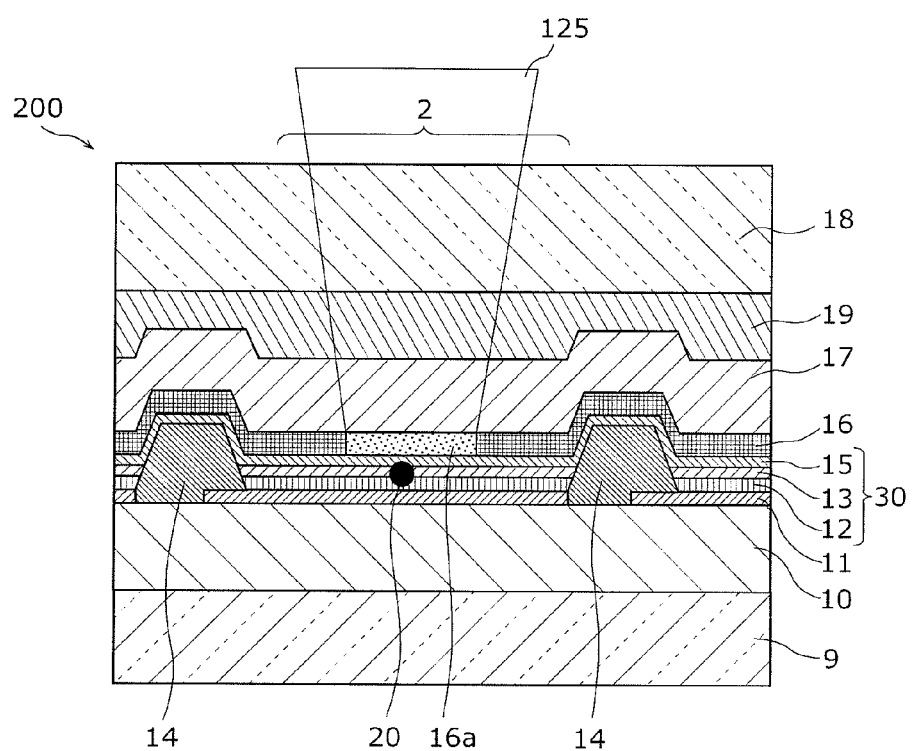
FIG. 18 is a cross-sectional schematic view of an organic EL device according to the embodiment 4.

FIG. 18 is a cross-sectional schematic view of the organic EL device 200 according to the embodiment 4. The foreign material 20 is larger than the cathode 11 and the cathode 16, and the foreign material 20 is not conducted with the anode 11 or the cathode 16. Since the distance between the foreign material 20 and the cathode 16 is short, the resistance is small, making it easier for the current flow.

As described above, even when the anode 11 and the cathode 16 are not fully conducted, the short between the anode 11 and the cathode 16 are fixed. Stated differently, in the same manner as the embodiment 1, the structure of the part of the cathode 16 is changed to the granular structure by irradiating the cathode 16 with the laser 125 from the side of the transparent glass 18, so as to increase the resistance of the part of the cathode 16. With this, it is possible to fix the short between the anode 11 and the cathode 16.

Figure 19:
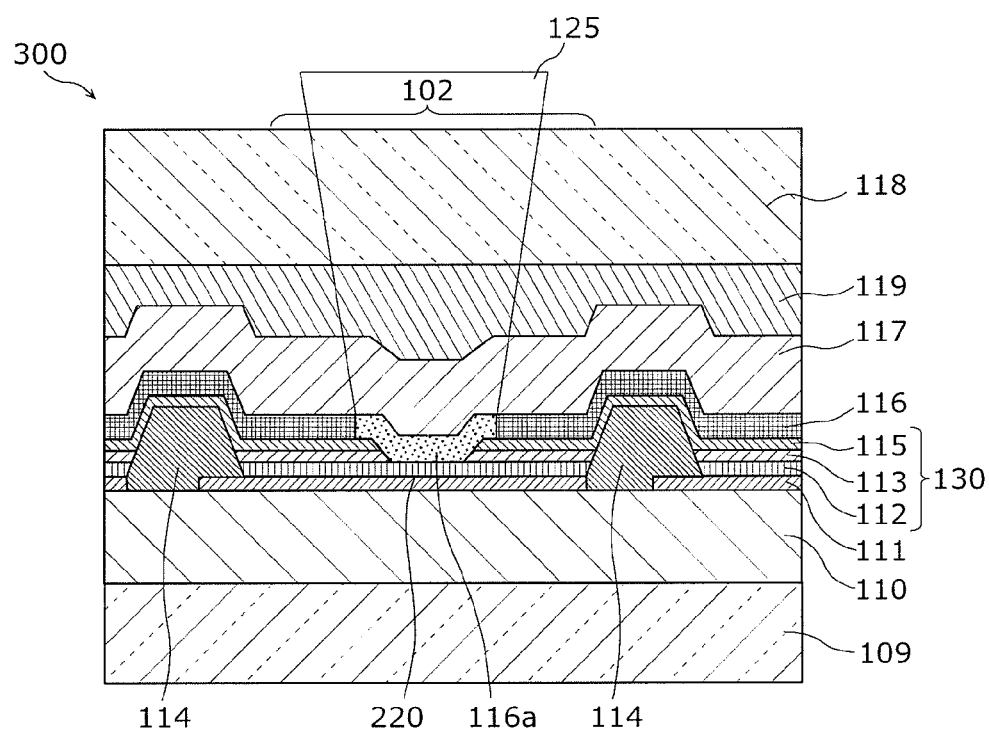
FIG. 19 is a cross-sectional schematic view of an organic EL device according to the embodiment 4.

FIG. 19 is a cross-sectional schematic view of the organic EL device 300 according to the embodiment 4. In FIG. 19, even though the anode 111 and the cathode 116 are not conducted, the distance between the anode 111 and the cathode 116 is short, and thus the resistance is small. Accordingly, the current is likely to flow in the shorted part 220 before the laser irradiation. This shorted part 220 is caused by a pin hole formed at the shorted part 220 in the forming process of the organic layer 130, and the material composing the cathode 116 flows into the pin hole during the forming process of the cathode 116, and the cathode 116 is formed.

As described above, even when the anode 111 and the cathode 116 are not fully conducted, the structure of the part 116a of the cathode 116 can be changed to the granular structure by irradiating the cathode 116 above the shorted part with the laser 125 from the side of the transparent glass 118, in the same manner as the embodiment 3. With this, the resistance of the part of the cathode 116 increases, fixing the short between the anode 111 and the cathode 116.

Figure 20:
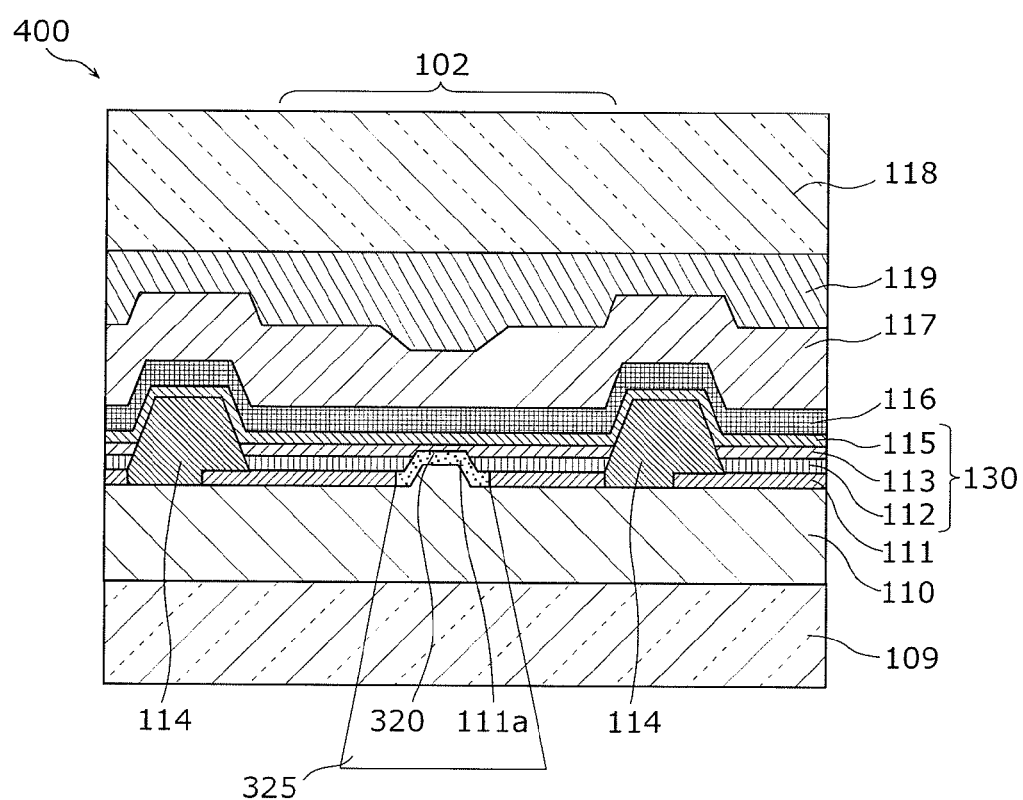
FIG. 20 is a cross-sectional schematic view of an organic EL device according to the embodiment 4.

FIG. 20 is a cross-sectional schematic view of the organic EL device 400 according to the embodiment 4. In FIG. 20, even though the anode 111 and the cathode 116 are not conducted, the distance between the anode 111 and the cathode 116 is short, and thus the resistance is small. Accordingly, the current is likely to flow in the shorted part 320. The shorted part 320 is a part where the planarizing film 110 is formed in a projecting shape in the process for forming the planarizing film 110, and the organic layer 130 and the cathode 116 are formed on the planarizing film 110.

As described above, even when the anode 111 and the cathode 116 are not fully conducted, the structure of the part of the anode 111 can be changed to the granular structure by irradiating the anode 111 corresponding to the shorted part with the laser 325 from the side of the transparent glass 109, in the same manner as the embodiment 3. With this, the resistance of the part of the anode 111 increases, fixing the short between the anode 111 and the cathode 116.

Note that, the present invention is not limited to the embodiments described above, and various modification and reformation can be made within the scope of the present invention.

For example, in the embodiments, the structure in which the lower electrode is the anode and the upper electrode is the cathode has been described. However, the lower electrode may be a cathode, and the upper electrode may be an anode. Furthermore, the structure of the planarizing film, the anode, the hole injection layer, the light-emitting layer, the bank, the electron injection layer, the cathode, the thin-film encapsulating layer, the encapsulating resin layer, and the transparent glass is not limited to the structure described in the embodiments, and the material, configuration, and the method for forming these layers may be changed. For example, a hole transport layer may be present between the hole injection layer and the light-emitting layer, and an electron transport layer may be present between the electron injection layer and the light-emitting layer. The organic EL device may further includes a color filter for adjusting colors in red, green, and blue under the transparent glass so as to cover the light-emitting regions separated by the bank.

Alternatively, the position for the laser irradiation is not limited to the embodiments described above, and may be set within the range including the foreign material and the shorted part, or only the foreign material or the shorted part. Alternatively, the position may be set to surround the foreign material or the shorted part. Alternatively, the laser irradiation may be performed not only on the cathode, but on the anode as well.

Figure 21:
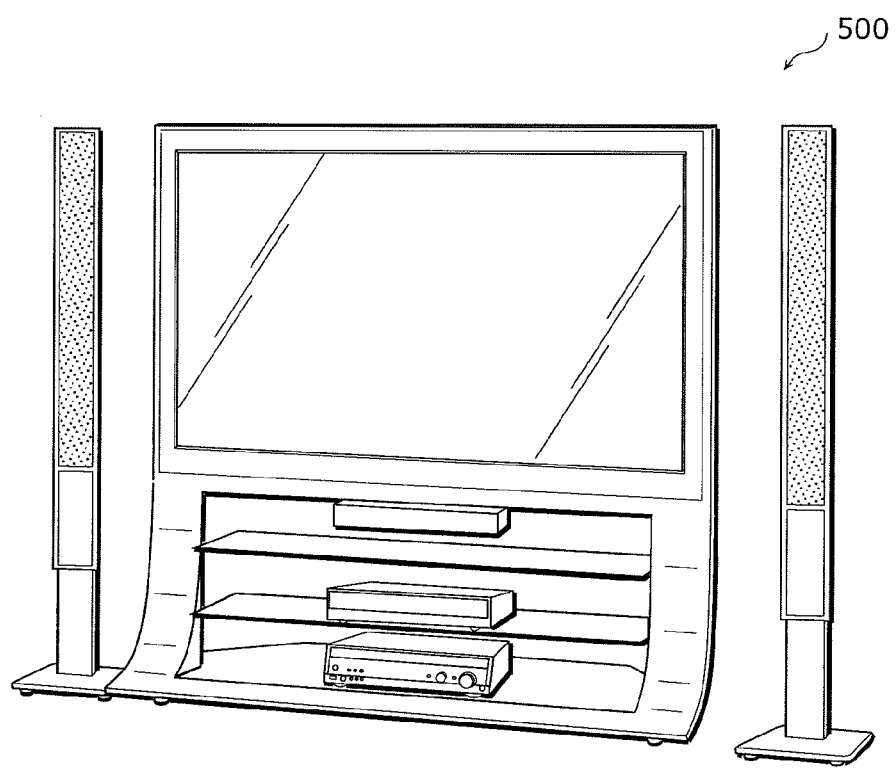
FIG. 21 is a view illustrating an external appearance of a television system including the organic EL device according to the present invention.

Although only some exemplary embodiments of the present invention have been described in detail above, those skilled in the art will readily appreciate that many modifications are possible in the exemplary embodiments without materially departing from the novel teachings and advantages of the present invention. Accordingly, all such modifications are intended to be included within the scope of the present invention. For example, a thin flat-screen television system including the organic EL device according to the present invention as illustrated in FIG. 21 is included in the present invention.

[Industrial Applicability]

The manufacturing method for the organic EL device and the organic EL device according to the present invention is useful for a technical field such as flat-screen televisions and displays for personal computers where a large screen and a high resolution are required.

[Reference Signs List]
1, 50, 100, 200, 300, 400 Organic EL device
2, 102 Pixel
11, 111 Anode (lower electrode)
12, 112 Hole injection layer (organic layer)
13, 113 Light-emitting layer (organic layer)
15, 115 Electron injection layer (organic layer)
16, 111 Cathode (upper electrode)
16a, 116a Part of cathode (granular structure)
20 Foreign material
25, 125, 325 Laser
30, 130 Organic layer
120, 220, 320 Shorted part

The invention claimed is:

1. A method for manufacturing an organic electroluminescence device, comprising:
    preparing an organic electroluminescence device including a lower electrode, an organic layer including a light-emitting layer, and an upper electrode and having a part in which the lower electrode and the upper electrode are shorted, at least one of the lower electrode and the upper electrode being made of a transparent conductive material; and
    irradiating the transparent conductive material in at least one of the part where the lower electrode and the upper electrode are shorted and a part around the shorted part with a femtosecond laser, and increasing resistance by changing a structure of the transparent conductive material,
    wherein, when irradiating the transparent conductive material with the femtosecond laser, the structure of the transparent conductive material in the at least one of the part where the lower electrode and the upper electrode are shorted and the part around the shorted part is changed to a granular structure.

2. The method for manufacturing the organic electroluminescence device according to claim 1,
    wherein a grain size of particles composing the granular structure is in a range from 10 to 500 nm.

3. The method for manufacturing the organic electroluminescence device according to claim 1,
    wherein a wavelength of the femtosecond laser is in a range from 900 to 2500 nm.

4. The method for manufacturing the organic electroluminescence device according to claim 1,
    wherein the transparent conductive material is a transparent metal oxide.

5. The method for manufacturing the organic electroluminescence device according to claim 1,
    wherein the transparent conductive material before being irradiated with the femtosecond laser is in an amorphous state.

6. The method for manufacturing the organic electroluminescence device according to claim 1,
    wherein a thickness of the lower electrode or the upper electrode made of the transparent conductive material is in a range from 10 to 40 nm.

7. The method for manufacturing the organic electroluminescence device according to claim 1, further comprising
    forming a protective layer above the upper electrode before irradiating the transparent conductive material with the femtosecond laser,
    wherein when irradiating the transparent conductive material with the femtosecond laser, the transparent conductive material of at least one of the shorted part and the part around the shorted part is irradiated with the femtosecond laser via the protective layer.

8. The method for manufacturing the organic electroluminescence device according to claim 1,
    wherein the shorted part includes a conductive foreign material in the organic layer.

9. The method for manufacturing the organic electroluminescence device according to claim 8, further comprising
    detecting the conductive foreign material,
    wherein the transparent conductive material around the conductive foreign material is irradiated with the laser.

10. The method for manufacturing the organic electroluminescence device according to claim 1,
    wherein a thickness of the organic layer in the shorted part is smaller than a thickness of the organic layer in a part other than the shorted part.

11. A method for manufacturing an organic electroluminescence device, comprising:
    preparing an organic electroluminescence device including a substrate having a thin-film transistor, a planarizing film formed above the substrate, a lower electrode formed above the planarizing film, an organic layer including a light-emitting layer, an upper electrode, and a protective layer formed in contact with a surface of the upper electrode, the organic electroluminescence device having a part in which the lower electrode and the upper electrode are shorted, at least one of the lower electrode and the upper electrode being made of a transparent conductive material; and
    irradiating the transparent conductive material in at least one of the part where the lower electrode and the upper electrode are shorted and a part around the shorted part via the protective layer with a femtosecond laser, and increasing resistance by changing a structure of the transparent conductive material,
    wherein, when irradiating the transparent conductive material with the femtosecond laser, the structure of the transparent conductive material in the at least one of the part where the lower electrode and the upper electrode are shorted and the part around the shorted part is changed to a granular structure.

\* \* \* \* \*